(12) United States Patent
Bhushan et al.

(10) Patent No.: US 7,190,233 B2
(45) Date of Patent: Mar. 13, 2007

(54) METHODS AND APPARATUS FOR MEASURING CHANGE IN PERFORMANCE OF RING OSCILLATOR CIRCUIT

(75) Inventors: Manjul Bhushan, Hopewell Junction, NY (US); Mark B. Ketchen, Hadley, MA (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 11/179,874

(22) Filed: Jul. 12, 2005

(65) Prior Publication Data
US 2007/0013452 A1    Jan. 18, 2007

(51) Int. Cl.
*G01R 23/00* (2006.01)
*H03B 5/24* (2006.01)

(52) U.S. Cl. .......................... 331/44; 331/57
(58) Field of Classification Search ............ 331/44–46, 331/48, 49, 57, 173, 177 R, 185, 186
See application file for complete search history.

(56) References Cited
U.S. PATENT DOCUMENTS
2005/0140418 A1* 6/2005 Muniandy et al. .......... 327/291

OTHER PUBLICATIONS

S. Rangan et al., "Universal Recovery Behavior of Negative Bias Temperature Instability," Electron Devices Meeting, IEDM '03 Technical Digest, IEEE International, 4 pages, Dec. 2003.

D. Schroder et al., "Negative Bias Temperature Instability: Road to Cross in Deep Submicron Silicon Semiconductor Manufacturing," Journal of Applied Physics, Applied Physics Reviews-Focused Review, vol. 94, No. 1, pp. 1-18, Jul. 2003.

K. Mueller et al., "6-T Cell Circuit Dependent GOX SBD Model for Accurate Prediction of Observed VCCMIN Test Voltage Dependency," Proceedings, 42nd Annual IEEE International Reliability Physics Symposium, 4 pages, Apr. 2004.

V. Reddy et al., "Impact of Negative Bias Temperature Instability on Digital Circuit Reliability,"40th Annual International Reliability Physics Symposium, pp. 248-254, 2002.

Y-H. Lee et al., "Effect of pMOST Bias-Temperature Instability on Circuit Reliability Performances," Electron Devices Meeting, IEDM '03 Technical Digest, IEEE International, 4 pages, Dec. 2003.

* cited by examiner

*Primary Examiner*—David Mis
(74) *Attorney, Agent, or Firm*—Ryan, Mason & Lewis, LLP

(57) ABSTRACT

An integrated circuit device is provided having one or more pairs of ring oscillator circuits. Each ring oscillator circuit of the one or more pairs of ring oscillator circuits is configured to connect to at least one voltage source capable of applying a stress to a ring oscillator circuit. One or more frequency measurement circuits are each electrically connected to a respective pair of the one or more pairs of ring oscillator circuits. Each frequency measurement circuit is configured to measure a stress induced change in frequency difference of the respective pair of the one or more pairs of ring oscillator circuits.

28 Claims, 5 Drawing Sheets

US 7,190,233 B2

METHODS AND APPARATUS FOR MEASURING CHANGE IN PERFORMANCE OF RING OSCILLATOR CIRCUIT

FIELD OF THE INVENTION

The present invention relates generally to integrated circuit devices and, more particularly, to inline techniques for measuring a change in performance of a ring oscillator circuit of an integrated circuit device caused by an applied stress.

BACKGROUND OF THE INVENTION

As scaling limits of complementary metal oxide semiconductor (CMOS) technology are neared, variability has been found to play an increasingly important role in integrated circuit performance. A change in performance of an integrated circuit over time may be caused by various stress mechanisms, such as, for example, hot electron effects in both negative channel field effect transistors (nFETs) and positive channel field effect transistors (pFETs), and negative bias temperature instability (NBTI) in pFETs. Over the lifetime of an integrated circuit, the performance of an integrated circuit may degrade by 5% or more due to such effects. In practice this anticipated future degradation may be provided for in a performance guard band specified with the integrated circuit performance prior to shipping to a customer.

The degradation of the characteristics of an individual FET in response to both hot electron effects and NBTI are frequently defined in terms of an increase in threshold voltage, Vt. Actual degradation due to various stress mechanisms has been increasing with CMOS scaling and is known to vary considerably based on the techniques utilized in the integrated circuit fabrication process. Developing an understanding of the dependence of such degradation on processing techniques for each new technology is an important and difficult task, and may involve accelerated stress testing and comprehensive evaluation of large populations of devices, such as, for example, individual FETs. More specifically, the Vt shift of each member of the population in response to the stress may be evaluated. Simulations may then be carried out to predict the impact on various circuit types.

Hot electron effects are strongest under conditions of low temperature and high source-drain voltage. When a ring oscillator device having inverter stages is stressed at room temperature and at high power supply voltage (Vdd), hot electron effects dominate the degradation response. Such an arrangement has been used as the basis of an inline test for diagnosing hot electron effects. The ring oscillator approach has the advantage of directly providing the circuit response to stress as opposed to the direct current (dc) FET response from which circuit response is inferred.

Thus, it would be highly desirable to provide inline testable structures that provide an indication of the stress induced performance degradation of an integrated circuit device after only a short stress period. It is also desirable for a collective response to stress to be directly measured without requiring measurement of each circuit individually. Additionally, because stressing at room temperature makes it difficult to differentiate NBTI from hot electron effects, and because elevated temperatures are impractical inline, to date there have been no effective inline tests that measure NBTI and distinguish it from hot electron effects.

SUMMARY OF THE INVENTION

The present invention provides techniques for inline testing of stress induced performance degradation after only a short stress period. More specifically, the embodiments of the present invention provide techniques for digitally calculating a difference in frequency between two nominally identical ring oscillator circuits, in close proximity, before and after an applied stress. The change in beat frequency, which is a differential quantity, is a precise measure of the change in average performance of a set of nominally identical circuits within a ring oscillator circuit with respect to a reference ring oscillator circuit and is relatively insensitive to variation in quantities such as common power supply voltage and external noise, as well as statistical variations within the set.

For example, in one aspect of the invention, an integrated circuit device is provided having one or more pairs of ring oscillator circuits. Each ring oscillator circuit of the one or more pairs of ring oscillator circuits is configured to connect to at least one voltage source capable of applying a stress to a ring oscillator circuit. One or more frequency measurement circuits are each electrically connected to a respective pair of the one or more pairs of ring oscillator circuits. Each frequency measurement circuit is configured to measure a stress induced change in frequency difference of the respective pair of the one or more pairs of ring oscillator circuits.

In an additional embodiment of the present invention, each of the one or more frequency measurement circuits is configured to measure a beat frequency of a pair of ring oscillator circuits before and after an applied stress to determine a change in beat frequency of the pair of ring oscillator circuits. Additionally, the integrated circuit device is provided having a frequency divider electrically connected to an output bus from the one or more pairs of ring oscillator circuits and the one or more frequency measurement circuits to reduce a frequency to a measurable range. The frequency measurement circuit is also provided having a first latch, a second latch and associated combinatorial logic.

In a further embodiment of the present invention, a method of measuring a frequency change of a ring oscillator circuit is provided. A pre-stress frequency difference of one or more pairs of ring oscillator circuits is measured at one or more corresponding frequency measurement circuits. A stress is applied to at least one ring oscillator circuit of one or more pairs of ring oscillator circuits through at least one voltage source. A post-stress frequency difference of the one or more pairs of ring oscillator circuits is measured at the corresponding frequency measurement circuits. The pre-stress frequency difference of each pair of ring oscillator circuits is compared to the post-stress frequency difference of each pair of ring oscillator circuits to determine a frequency change of a ring oscillator circuit due to the applied stress.

This differential approach allows one to obtain a clean signal in response to a very short stress. In addition, by configuring the ring stages in an appropriate fashion it is possible to have one stress mechanism dominate the response of the circuit to stressing.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

As will be illustrated in detail below, the present invention introduces techniques for inline testing of stress induced performance degradation after a short stress period by measuring a change in frequency of a ring oscillator circuit.

Figure 1:
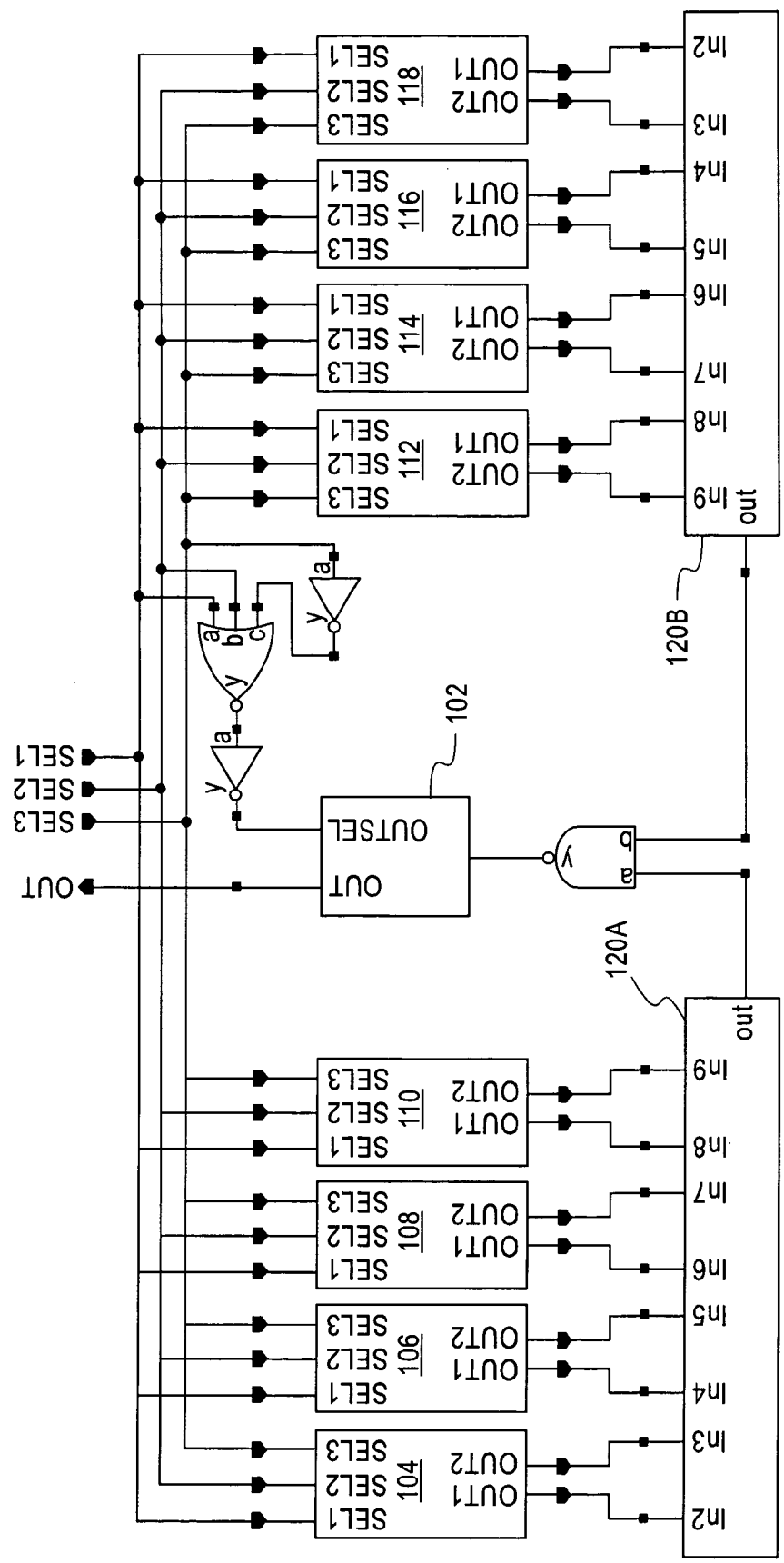
FIG. 1 is a circuit diagram illustrating a circuit for inline measurement of ring oscillator circuit device frequency change, according to an embodiment of the present invention.

Referring initially to FIG. 1, a top level circuit diagram illustrates a circuit for inline measurement of ring oscillator circuit device frequency change, according to an embodiment of the present invention. Four pairs of ring oscillator circuits 104, 106, 108, 110 are disposed on a left side of a frequency divider 102, and four pairs of ring oscillator circuits 112, 114, 116, 118 are disposed on a right side of frequency divider 102. Each ring oscillator circuit may be powered independently via separate power supplies or separate I/O pads of a common power supply. The pairs of ring oscillator circuits may also be powered by a common power supply or pad. The pairs of ring oscillator circuits share common select circuitry, and control inputs SEL1, SEL2, SEL3 are used to select which ring circuitry is active at any given point in time.

Output signals OUT1 and OUT2 from each pair of ring oscillator circuits 104, 106, 108, 110 on the left side of frequency divider 102 are independently ORed into a first common output bus 120A. Output signals OUT1 and OUT2 from each pair of ring oscillator circuits 112, 114, 116, 118 on the right side of frequency divider 102 are independently ORed into a second common output bus 120B. First and second output buses 120A, 120B are ORed to connect as a single input to frequency divider 102.

Frequency divider 102 reduces the input frequency to a range that may be easily measured with a parametric test, for example, a few megahertz (MHz) or less. When an individual ring is being measured, the frequency input to frequency divider 102 is divided by, for example, 256. When a frequency difference is being measured, frequency divider 102 is reconfigured to divide by, for example, 32. However, as will be described in more detail below with regard to FIG. 2, because the output from a beat frequency generation circuit is a frequency that is half the difference frequency of the pair of ring oscillator circuits, in this embodiment of the present invention frequency divider 102 divides the output by, for example, 64.

Figure 2:
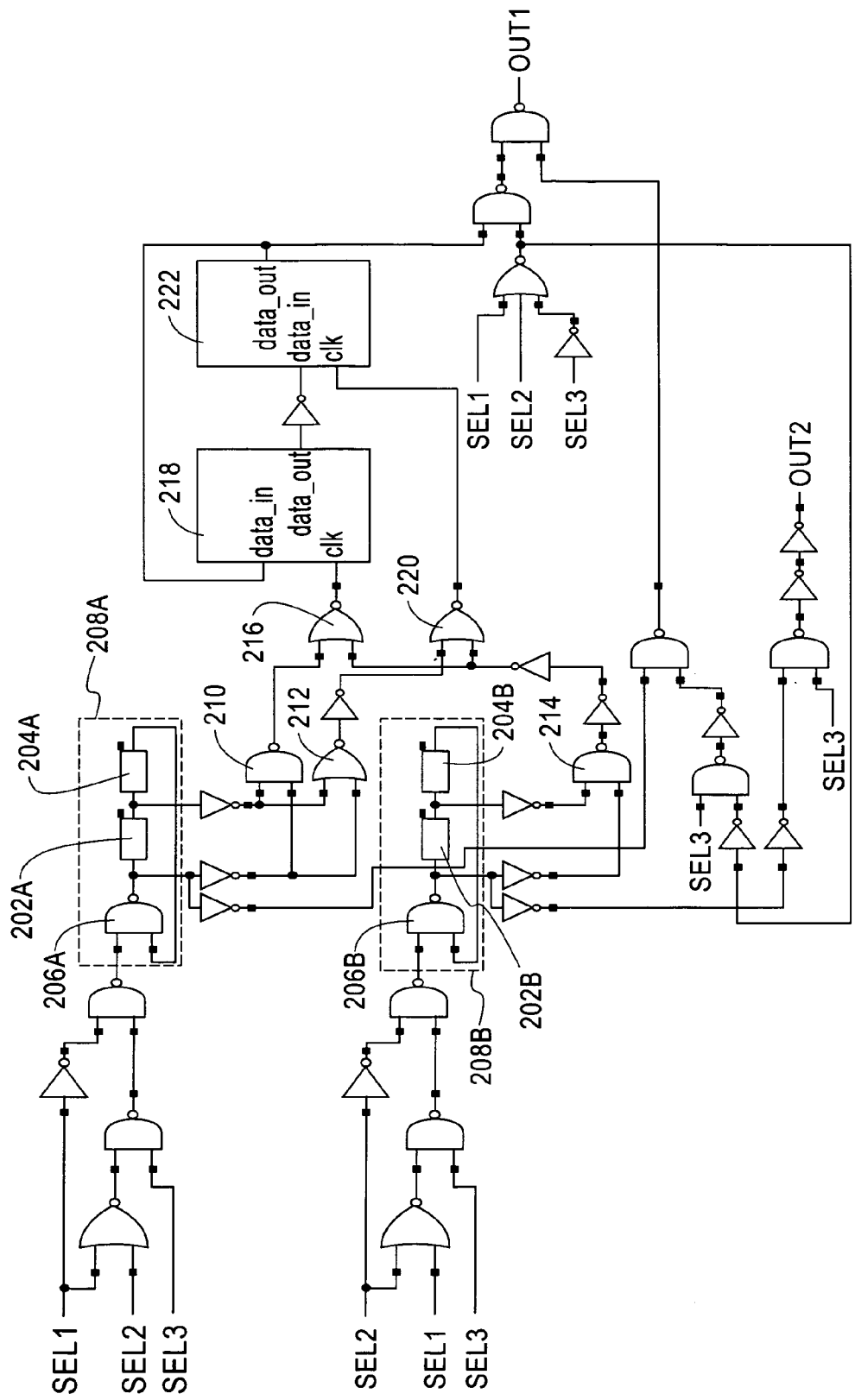
FIG. 2 is a circuit diagram illustrating a pair of ring oscillator circuit devices, control circuitry and beat frequency generation circuitry, according to an embodiment of the present invention.

Referring now to FIG. 2, a circuit diagram illustrates a pair of ring oscillator circuits, according to an embodiment of the present invention. More specifically, FIG. 2 illustrates two ring oscillator circuits and digital beat frequency generation circuitry. This may be considered a detailed description of any pair of ring oscillator circuits 104, 106, 108, 110, 112, 114, 116, 118. Each ring oscillator circuit has an m-stage segment 202A, 202B, and a 3m-stage segment 204A, 204B, where m=25 in this embodiment of the present invention. Each ring oscillator circuit also has a corresponding enabling NAND2 gate 206A, 206B. Across 25-stage segment 202A of a first ring oscillator circuit 208A are a NAND2 circuit 210 and a NOR2 circuit 212. Across 25-stage segment 202B of a second ring oscillator circuit 208B is a NAND2 circuit 214. The outputs of NAND2 circuit 210 and NAND2 circuit 214 are NORed together at NOR2 circuit 216. The output of NOR2 circuit 216 drives a clock input of a first latch 218. The output of NOR2 circuit 212 and NAND2 circuit 214 are NORed together at NOR2 circuit 220. The output of NOR2 circuit 220 drives a clock input of a second latch 222. Additionally, inverters are provided in the circuit as illustrated in FIG. 2. Additional embodiments may provide inverters as necessary to obtain desired logic function. First latch 218 and second latch 222 together with the combinatorial logic across the 25-stage segments of first and second ring oscillator circuits 208A, 208B, embody a frequency measurement circuit, more specifically, a beat frequency generation circuit, which calculates half a difference in frequency between first and second ring oscillator circuits 208A, 208B.

With both first ring oscillator circuit 208A and second ring oscillator circuit 208B running at similar but somewhat different frequencies, the outputs of each pre-latch NOR2 circuit 216, 220 is a train of varying width pulses at approximately an average frequency, followed by a period of no output (quiet period), followed by another train of pulses, and so on. The length of time that a NOR2 circuit is emitting pulses is shorter than the quiet period. The period of pulse generation for one NOR2 circuit is centered approximately on the quiet period of the other NOR2 circuit, and vice versa. With these inputs to the clocks of the two latches 218, 222, configured as shown in FIG. 2, the net result is a roughly square wave oscillation around the latch pair at a frequency of half the difference frequency of the two ring oscillator circuits. The clock input signal that initiates a latch transition is the first pulse in a burst from a pre-latch NOR2 circuit of sufficient amplitude to allow the new 1 or 0 in the data port to pass through.

As described above with regard to FIG. 1, three control inputs SEL1, SEL2 and SEL3 are used to enable the outputs OUT1, OUT2 of a pair of ring oscillator circuit devices. For example, as shown below in Table 1, the output of first ring oscillator circuit 208A is provided through OUT1 when SEL1, SEL2 and SEL3 are set to 1, enabling both Ring 1 and Ring 2, and when SEL1 and SEL3 are set to 1 (with SEL2=0), enabling only Ring 1. The output of second ring oscillator circuit 208B is provided through OUT2 when both SEL1 and SEL2 are set to 1 (with SEL3=0), enabling both Ring 1 and Ring 2, and when SEL2 is set to 1 (with SEL1=SEL 3=0), enabling only Ring 2. The output of the beat frequency generation circuit is provided through OUT1 when only SEL3 is set to 1 (with SEL1=SEL2=0), enabling both Ring 1 and Ring 2.

TABLE 1

Truth table for operation of the circuit shown in FIG. 2.

| SEL1 | SEL2 | SEL3 | OUT1 | OUT2 | Ring 1 | Ring 2 |
|---|---|---|---|---|---|---|
| 1 | 1 | 0 | 0 | X | Enabled | Enabled |
| 1 | 1 | 1 | X | 0 | Enabled | Enabled |
| 1 | 0 | 0 | 0 | 0 | Enabled | 0 |
| 1 | 0 | 1 | X | 0 | Enabled | 0 |
| 0 | 1 | 0 | 0 | X | 0 | Enabled |
| 0 | 1 | 1 | 0 | 0 | 0 | Enabled |
| 0 | 0 | 0 | 0 | 0 | 0 | 0 |
| 0 | 0 | 1 | X (BEAT) | 0 | Enabled | Enabled |

Figure 3:
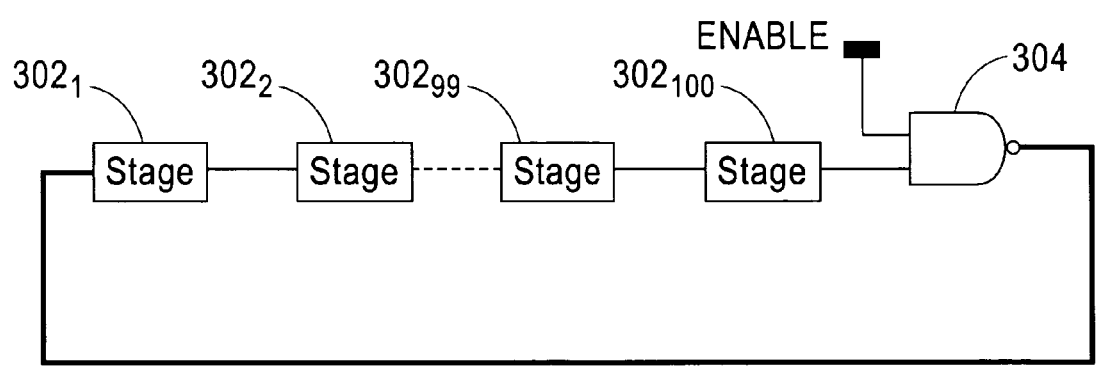
FIG. 3 is a diagram illustrating a ring oscillator circuit, according to an embodiment of the present invention.

Referring now to FIG. 3, a diagram illustrates a ring oscillator circuit, according to an embodiment of the present invention. This may be considered a detailed description of first ring oscillator circuit 208A and/or second ring oscillator circuit 208B in FIG. 2. As described above, in this embodiment of the present invention, each ring oscillator circuit has an m=25-stage segment and a 3 m=75-stage segment resulting in a ring of 100 stages $302_1 \ldots 302_{100}$, as well as an enabling NAND gate 304, as shown in FIG. 3.

In practice, the way in which a specific FET is stressed is dependent upon how it is configured within a circuit. Therefore, it is of interest to examine the response of a number of different circuit types. Eight different ring stage designs are provided in Table 2 with a relative threshold voltage (Vt). For example, in this embodiment of the present invention, inverters, NANDs, and NORs are standard product representative two-finger designs with wn/wp=2.5 μm/3.75 μm, and loaded with a wn/wp=2.5 μm/3.75 μm capacitive gate load. For the NANDs and NORs, T and B indicate that the gate in the nFET (NAND) or pFET (NOR) stack that is switching is farthest (T) or closest (B) to the respective ground or power bus. The passgate/inverter circuits have a product representative inverter driving the subsequent stage through an n- or p-passgate, the gate of which is held at Vdd or ground respectively. For example, in this embodiment of the present invention, p-passgates are 1.5 um wide and n-passgates are 1.0 um wide.

TABLE 2

Description of ring oscillators in the BEAT macro.

| RING | CIRCUIT | THRESHOLD |
|---|---|---|
| beat_S01 | INV | regular Vt |
| beat_S02 | PPG/INV | regular Vt |
| beat_S03 | PPG/INV | low Vt |
| beat_S04 | PPG/INV | high Vt |
| beat_S05 | NPG/INV | regular Vt |
| beat_S06 | NAND3B | regular Vt |
| beat_S07 | NOR3B | regular Vt |
| beat_S08 | NOR3T | regular Vt |

In a simplest case, for example, in a ring oscillator circuit of beat_S01, a stage is embodied as a basic inverter (INV). In order to determine a difference in frequency due to hot electron effects, individual ring oscillator circuits of the pair of ring oscillator circuits having inverter stages may be powered independently through separate voltage supplies or a common voltage supply with separate power pads. This allows one ring to be powered while the other is not, thereby providing a variety of voltage stressing options. For example, a first ring oscillator circuit of a pair of ring oscillator circuits may be stressed under alternating current (AC) or DC conditions, while a second ring oscillator circuit of the pair of ring oscillator circuits is unstressed. Alternatively, the first ring oscillator circuit may be stressed under AC conditions while the second ring oscillator circuit is stressed under DC conditions. When a post-stressed beat frequency is measured and compared to a pre-stressed beat frequency, the change in frequency of a ring oscillator circuit due to hot electron effects may be determined.

Figure 4:
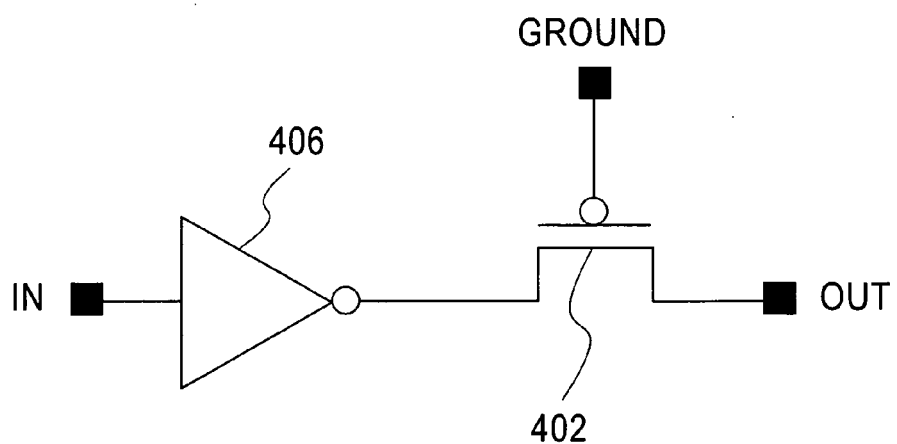
FIG. 4 is a circuit diagram illustrating a p-passgate/inverter circuit stage of a ring oscillator circuit, according to an embodiment of the present invention.

Also included in Table 2 are p-passgate/inverter circuit stages (PPG/INV), in ring oscillator circuits of beat_S02, S03, S04, which allow for voltage stressing for an inline NBTI analysis with minimal hot electron degradation. Referring now to FIG. 4, a circuit diagram illustrates a p-passgate/inverter circuit stage of a ring oscillator circuit, according to an embodiment of the present invention. This may be considered a detailed description of a stage 302 in FIG. 3. The p-passgate/inverter circuit stage has a p-passgate 402 and an inverter 406 connected together in series.

When the ring oscillator circuit is operating, each p-passgate 402 is stressed half the time with its source and drain at approximately Vdd and its gate at ground. The source-drain voltage does not exceed Vdd/4 during switching transitions, which provides little opportunity for hot electron degradation of the p-passgate. If the ring is stressed under DC conditions (elevated Vdd, with select input at ground) half the p-passgates in the ring will not be stressed at all, but the other half will receive a full Vdd (from source and drain to gate) stress for the duration of the stress. Therefore, by comparing the degradation of a basic inverter circuit to that of a corresponding p-passgate/inverter circuit the NBTI response of the p-passgate can be directly measured.

Alternatively, it is possible for the gate terminals of the p-passgates of one of the two ring oscillator circuits to be connected to an independent voltage source, Vg. In such an embodiment, both ring oscillators can share the same Vdd I/O pad. An NBTI stress may then be imposed by setting Vdd=0 and Vg equal to, for example, −2V. Since the p-passgates of just one of the rings are stressed with Vdrain=Vsource=0, a pure NBTI stress is produced with no hot electron stress. The inverters need never see Vdd greater than that used for the pre- and post-stress beat frequency measurement (which can be well below nominal operating voltage), so the inverters will get no NBTI or hot electron stress. The change in beat frequency caused by the stress will thus result entirely from the stress of the p-passgates. The same Vg also enables a direct calibration of ring beat frequency vs. Vt, since to a first order the frequency change induced by a given small delta Vg will be the same as that induced by an identical delta Vt, having a magnitude the same as delta Vg but opposite in sign. A similar embodiment with an n-passgate may be provided to verify that NBTI-like effects are not present in nFETs.

The eight ring oscillator circuits, beat_S02, S03, S04, S05, S06, S07, and S08, shown in Table 2 may correspond with ring oscillator pairs 106, 108, 110, 112, 114, 116 and 118 of FIG. 1. By providing eight different pairs of ring oscillators with differing stages, the pairs of ring oscillators may also be compared to determine a dominant response of the integrated circuit to specific stress mechanism, which may be measured in response to an applied stress. Thus, by comparing the degradation of a pair of basic inverter stage ring oscillator circuits, beat_S01 of Table 2, with that of a pair of corresponding inverter/p-passgate stage ring oscillator circuits, beat_S02, 03, 04 of Table 2, the NBTI response of the p-passgate can be directly determined.

Figure 5:
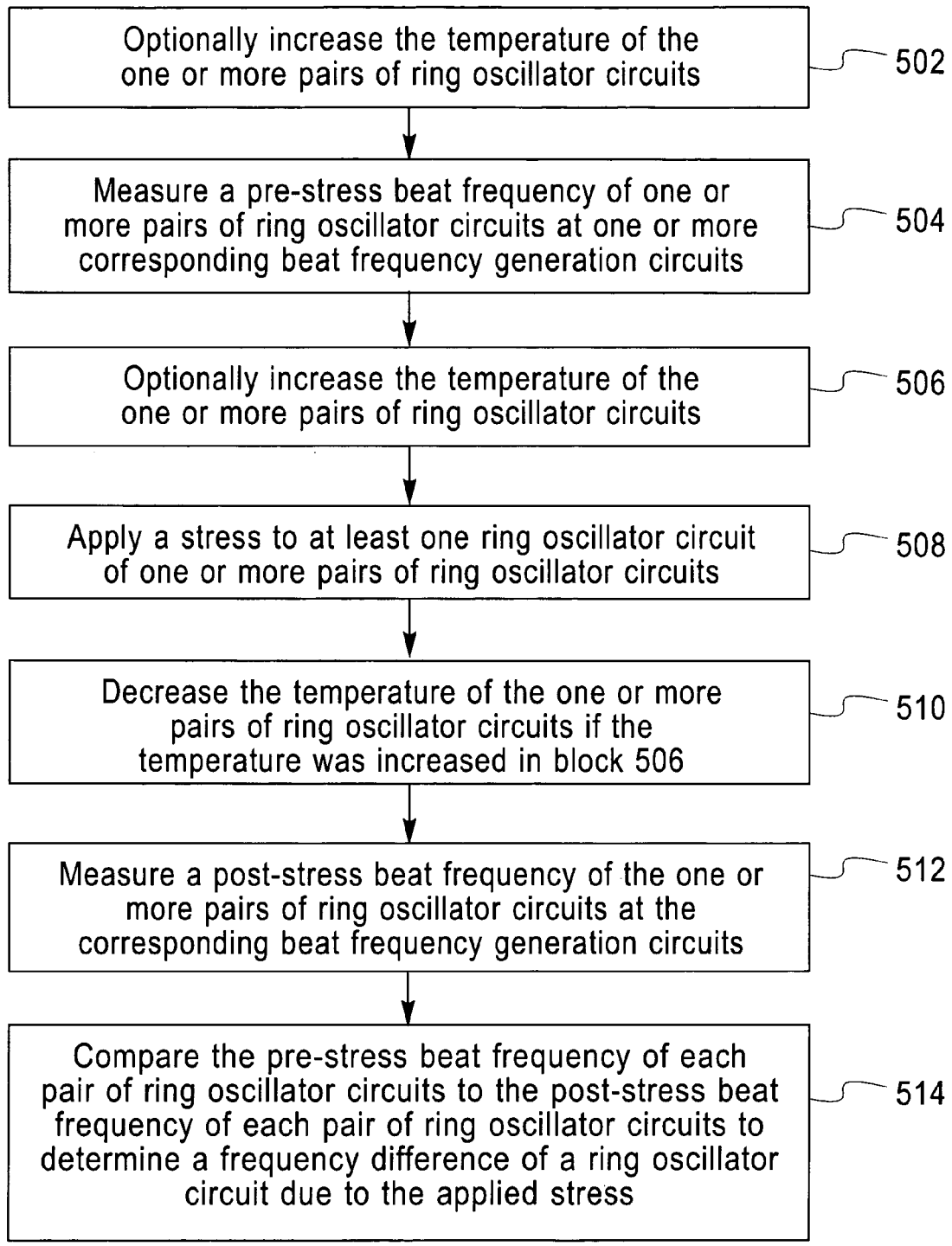
FIG. 5 is a flow diagram illustrating a ring oscillator frequency change measurement methodology, according to an embodiment of the present invention.

Referring now to FIG. 5, a flow diagram illustrates a frequency change measurement methodology, according to an embodiment of the present invention. The methodology begins in block 502, where the temperature of one or more pairs of ring oscillator circuits is optionally increased. In block 504, a pre-stress beat frequency of one or more pairs of ring oscillator circuits is measured at one or more corresponding beat frequency generation circuits, as shown in ring oscillator circuits 208A, 208B and beat frequency generation circuit of FIG. 2. Optionally, in block 506, the temperature of the one or more pairs of ring oscillator circuits may be increased.

In block 508, a stress is applied to at least one ring oscillator circuit of one or more pairs of ring oscillator circuits. As described above, the stress may be applied by stressing a first independently powered ring oscillator circuit of a pair of ring oscillator circuits under AC or DC conditions while the second ring oscillator circuit of the pair of ring oscillator circuits is unstressed. The stress may be applied by stressing a first independently powered ring oscillator circuit of a pair of ring oscillator circuits under AC conditions, while a second ring oscillator circuit of the pair of ring oscillator circuits is stressed under DC conditions. The stress may also be applied by independently biasing gates (of the passgates) of a first ring oscillator circuit of a pair of ring oscillator circuits at a high negative voltage, while a common power supply to the pair of ring oscillator circuits is held at ground potential.

In block 510, the temperature of the one or more pairs of ring oscillator circuits may optionally be decreased if the temperature of the one or more pairs of ring oscillator circuits was increased in block 506. In block 512, a post-stress beat frequency of the one or more pairs of ring oscillator circuits is measured at the corresponding beat frequency generation circuits in the same manner described above with regard to block 504. Finally, in block 514, the pre-stress beat frequency of each pair of ring oscillator circuits is compared to the post-stress beat frequency of each pair of ring oscillator circuits to determine a frequency change of a ring oscillator circuit due to the applied stress.

While the emphasis of the embodiments of the present invention provide a capability for performing rapid measurements of the impact of stress on circuit performance at ambient temperature, as described above, the structure may also be stressed at elevated temperatures. In the methodology, for example in block 502 of FIG. 5, the temperature of the circuit may be raised from an ambient temperature of, for example, approximately 25° C., to an operating temperature of, for example, approximately 85° C. Additionally, in block 506 this operating temperature may be increased to a thermal stress temperature of, for example, approximately 130° C. The circuit is then stressed at this elevated temperature. After stressing, the temperature may then be decreased to the operating temperature. This results in a more pronounced response from some mechanisms, such as NBTI, but also adds considerably to the test time, since the circuit under test must now be heated and cooled. Additional embodiments of the present invention may increase the temperature from ambient temperature to operating temperature in block 502 but remain at operating temperature for both the measurement and stressing steps.

As described above with regard to FIG. 1 and Table 2, an integrated circuit device may have multiple pairs of ring oscillator circuits each having different circuit stages. In such an embodiment, the methodology may continue by comparing the pre-stress beat frequency and post-stress beat frequency of each pair of ring oscillator circuits to determine the response of different circuit types. Such a comparison is shown below with regard to FIGS. 6 and 7.

Figure 6:
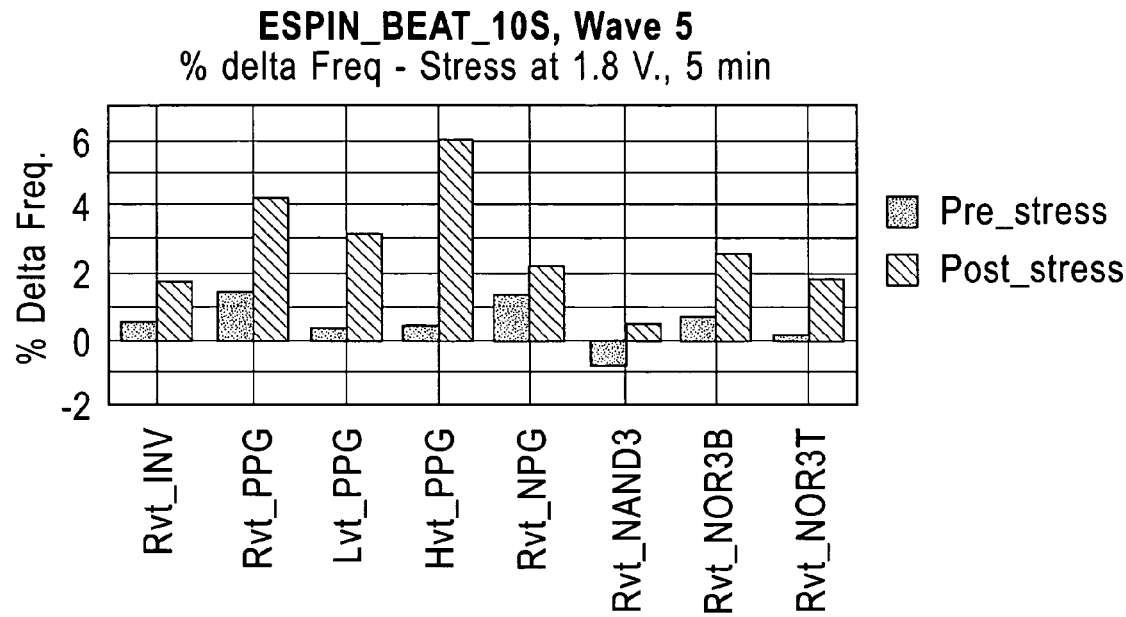
FIG. 6 is a graph illustrating beat frequency results, according to an embodiment of the present invention.

Referring now to FIG. 6, a graph illustrates beat frequency results, according to an embodiment of the present invention. The results are representative of a 5 minute 1.8V room temperature stress of each of the eight ring pairs shown in Table 2, in a circuit such as that shown in FIG. 1, and fabricated in 90 nm partially depleted Silicon-On-Insulator (SOI) technology. The stressed ring is running while it is being stressed and the beat frequency is measured with both rings sharing a common Vdd=0.8V power supply. The graph illustrates a pre-stress and post-stress difference in frequency for each of the pairs of ring oscillator circuits.

As anticipated for NBTI dominated shifts, the p-passgate/inverter circuits having a regular threshold voltage, Rvt_PPG, a low threshold voltage, Lvt_PPG, and a high threshold voltage, Hvt_PPG, demonstrate the largest effect, followed by the NOR gates having a regular threshold voltage Rvt_NOR3B, Rvt_NOR3T. The inverter, NAND, and inverter/n-passgate circuits all show effects of approximately 1% which are likely hot electron dominated. The high threshold voltage p-passgate/inverter circuit shows the biggest effect with approximately 6% degradation. With shorter stress times the stress induced performance change remains substantial for this circuit as illustrated below with regard to FIG. 7.

Figure 7:
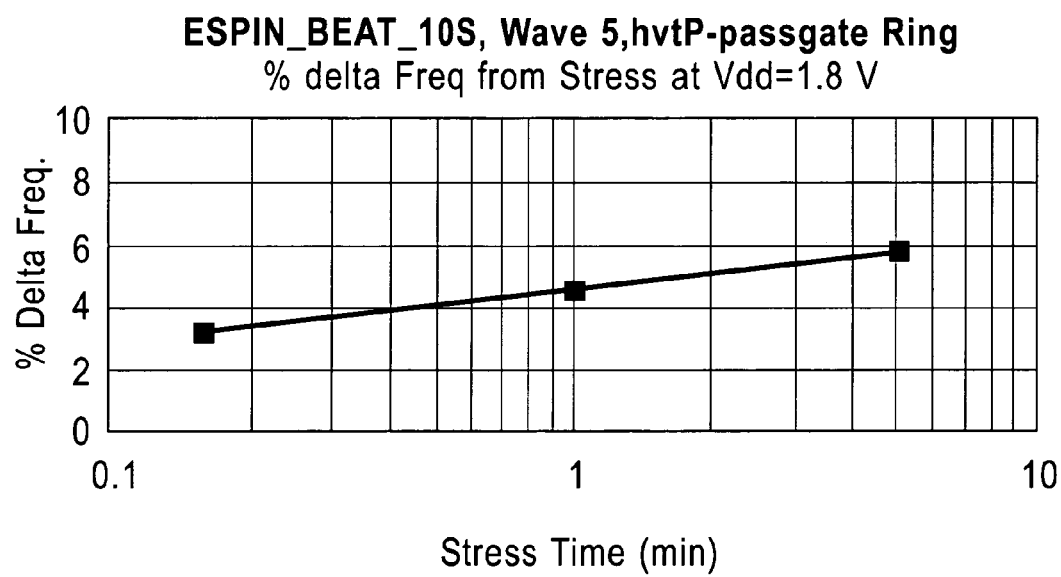
FIG. 7 is a graph illustrating beat frequency change versus stress time, according to an embodiment of the present invention.

Referring now to FIG. 7, a graph illustrates frequency change versus stress time, according to an embodiment of the present invention. Specifically, FIG. 7 illustrates the percent difference in frequency for the high threshold p-passgate/inverter circuit. With shorter stress times the stress induced performance change remains substantial for this circuit. As shown, a 1.8V stress for 10 seconds results in a 3% frequency reduction for the high threshold voltage p-passgate/inverter circuit.

In an additional embodiment of the present invention, the ring oscillator circuits of a pair of ring oscillator circuits are provided with a slightly different number of stages, for example 2 or 4 stages. Because substantially identical ring oscillator circuits have some small difference in frequency, when a higher frequency ring oscillator circuit is stressed, thereby lowering the frequency, the measured frequency difference between the two ring oscillator circuits after stressing may differ from the measurement that would result from a stressing of the lower frequency ring oscillator circuit. A ring oscillator circuit with the larger number of stages will produce a lower frequency, therefore, when a pair of ring oscillator circuits are provided having different numbers of stages, the methodology may knowingly stress the lower frequency ring oscillator circuit without independently measuring both ring oscillator circuits to determine which has the lower frequency. This eliminates the error that may occur when a higher frequency ring oscillator circuit of a pair of substantially identical ring oscillator circuits is stressed.

An additional use for the embodiments of the present invention is the comparison of the performance of two designs with small layout differences. Accurately evaluating parasitic capacitances and resistances, as is important for obtaining an optimized layout, is often a very difficult task which is aggravated by the fact that process biases can result in features that vary considerably from what might be expected from the layout data. The embodiments of the present invention allow for features to be systematically varied in the layout and the direct measurement of the performance difference (both delay and leakage) between the adjusted design and a standard reference design.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An integrated circuit device comprising:
   one or more pairs of ring oscillator circuits, wherein each ring oscillator circuit of the one or more pairs of ring oscillator circuits is configured to connect to at least one voltage source capable of applying a stress to a ring oscillator circuit; and
   one or more frequency measurement circuits each electrically connected to a respective pair of the one or more pairs of ring oscillator circuits, wherein each frequency measurement circuit is configured to measure a stress induced change in frequency difference of the respective pair of the one or more pairs of ring oscillator circuits.

2. The integrated circuit device of claim 1, wherein each frequency measurement circuit is configured to measure a beat frequency of the respective pair of one or more pairs of ring oscillator circuits before and after an applied stress to determine a change in beat frequency to the respective pair of the one or more pairs of ring oscillator circuits.

3. The integrated circuit device of claim 1, further comprising a frequency divider electrically connected to the one or more pairs of ring oscillator circuits and the one or more frequency measurement circuits to reduce an input frequency to a measurable range.

4. The integrated circuit device of claim 1, further comprising an output bus that electrically connects the one or more pairs of ring oscillator circuits and the one or more frequency measurement circuits to the frequency divider.

5. The integrated circuit device of claim 1, wherein each ring oscillator circuit in a pair of ring oscillator circuits is in close proximity and substantially identical.

6. The integrated circuit device of claim 1, wherein each ring oscillator circuit in a pair of ring oscillator circuits has a different number of stages.

7. The integrated circuit device of claim 1, wherein each ring oscillator circuit comprises an m-stage segment, a 3m-stage segment, and an enabling NAND gate.

8. The integrated circuit device of claim 7, wherein the one or more frequency measurement circuits each comprise a first latch, a second latch and combinatorial logic across the m-stage segments of each ring oscillator circuit.

9. The integrated circuit device of claim 1, wherein a pair of ring oscillator circuits comprise a plurality of at least one of inverter stages, NAND stages and NOR stages.

10. The integrated circuit device of claim 1, wherein each ring oscillator circuit in a pair of ring oscillator circuits are independently powered.

11. The integrated circuit device of claim 1, wherein a pair of ring oscillator circuits comprise a plurality of p-passgate/inverter stages.

12. The integrated circuit device of claim 11, wherein a pair of ring oscillator circuits share a common power supply.

13. A method of measuring a frequency change of a ring oscillator circuit comprising the steps of:
   measuring a pre-stress frequency difference of one or more pairs of ring oscillator circuits at one or more corresponding frequency measurement circuits;
   applying a stress to at least one ring oscillator circuit of one or more pairs of ring oscillator circuits through at least one voltage source;
   measuring a post-stress frequency difference of the one or more pairs of ring oscillator circuits at the one or more corresponding frequency measurement circuits; and
   comparing the pre-stress frequency difference of each pair of ring oscillator circuits to the post-stress frequency difference of each pair of ring oscillator circuits to determine a frequency change of a ring oscillator circuit due to the applied stress.

14. The method of claim 13, wherein, in the steps of measuring a pre-stress and a post-stress frequency difference, the frequency difference comprises a beat frequency.

15. The method of claim 13, further comprising the step of increasing a temperature of the one or more pairs of ring oscillator circuits from a lower temperature to a constant higher temperature before the step of measuring a pre-stress frequency difference.

16. The method of claim 13, further comprising the steps of:
   increasing a temperature of the one or more pairs of ring oscillator circuits from a lower temperature to a constant higher temperature after the step of measuring a pre-stress frequency difference; and
   decreasing the temperature of the one or more pairs of ring oscillator circuits from the constant higher temperature to the lower temperature before the step of measuring a post-stress frequency difference.

17. The method of claim 13, further comprising the steps of:
   increasing a temperature of the one or more pairs of ring oscillator circuits from a first temperature to a constant relatively higher second temperature before the step of measuring a pre-stress frequency difference;
   increasing the temperature of the one or more pairs of ring oscillator circuits from the second temperature to a constant relatively higher third temperature after the step of measuring a pre-stress frequency difference; and
   decreasing the temperature of the one or more pairs of ring oscillator circuits from the constant higher third temperature to the second temperature before the step of measuring a post-stress frequency difference.

18. The method of claim 13, wherein the step of applying a stress comprises the step of stressing at least one ring oscillator circuit of the one or more pairs of ring oscillator circuits under AC conditions.

19. The method of claim 13, wherein the step of applying a stress comprises the step of stressing at least one ring oscillator circuit of the one or more pairs of ring oscillator circuits under DC conditions.

20. The method of claim 13, wherein the step of applying a stress comprises the step of stressing a first ring oscillator circuit of a pair of ring oscillator circuits under AC conditions and a second ring oscillator circuit of the pair of ring oscillator circuits under DC conditions.

21. The method of claim 13, wherein the step of applying a stress comprises independently biasing one or more gates of a first ring oscillator circuit of a pair of ring oscillator circuits while holding a common power supply of the pair of ring oscillator circuits at ground potential.

22. The method of claim 21, wherein the one or more gates comprise one or more passgates.

23. The method of claim 22, further comprising the step of determining a change in beat frequency for a change in threshold voltage by measuring a change in beat frequency induced by an equivalent change in the independent bias voltage of the first ring oscillator circuit.

24. The method of claim 21, wherein, in the step of independently biasing gates, the gates are biased at a substantially high negative voltage.

25. The method of claim 13, wherein the one or more pairs of ring oscillator circuits comprise at least two pairs of ring oscillator circuits, each pair of ring oscillator circuits having different types of circuit stages, and further comprising the step of comparing the pre-stress frequency difference and post-stress frequency difference of each pair of ring oscillator circuits.

26. The method of claim 13, wherein the each ring oscillator circuit in a pair of ring oscillator circuits comprise a different number of stages, wherein the step of applying a stress comprises the step of applying a stress to a ring oscillator circuit of the one or more pairs of ring oscillator circuits having a larger number of stages.

27. A frequency measurement circuit comprising:
a first latch having an input clock signal;
a second latch having an input clock signal, and electrically connected to the first latch;
combinatorial logic across a segment of a first ring oscillator circuit and across a segment of a second ring oscillator circuit, wherein the combinatorial logic drives the clock signal of the first latch and the second latch;
wherein the frequency measurement circuit is configured to measure a stress induced change in frequency difference of the first ring oscillator circuit and the second ring oscillator circuit.

28. The frequency measurement circuit of claim 27, wherein:
the combinatorial logic driving the clock signal of the first latch comprises a first NAND2 circuit across the segment of the first ring oscillator circuit, a second NAND2 circuit across the segment of a second ring oscillator circuit, a first NOR2 circuit combining outputs from the first NAND2 circuit and the second NAND2 circuit, and one or more inverters; and
the combinatorial logic driving the clock signal of the second latch comprises a second NOR2 circuit across the segment of the first ring oscillator circuit, the second NAND2 circuit across the segment of the second ring oscillator circuit, a third NOR2 circuit combining outputs from the second NOR2 circuit and the second NAND2 circuit, and one or more inverters.

* * * * *